United States Patent
Thakur et al.

(10) Patent No.: US 6,262,485 B1
(45) Date of Patent: Jul. 17, 2001

(54) USING IMPLANTS TO LOWER ANNEAL TEMPERATURES

(75) Inventors: Randhir P. S. Thakur, Boise; Michael Nuttall, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/258,465

(22) Filed: Feb. 26, 1999

Related U.S. Application Data (62) Division of application No. 09/131,453, filed on Aug. 10, 1998, which is a division of application No. 08/676,587, filed on Jul. 8, 1996.

(51) Int. Cl.$^7$ .............................. H01L 23/48; H01L 23/12
(52) U.S. Cl. ................... 257/757; 257/384; 257/456; 257/486; 257/758; 438/627; 438/630; 438/649
(58) Field of Search ................... 257/757, 384, 257/456, 486, 758, 768; 438/627, 630, 649, 659

(56) References Cited

U.S. PATENT DOCUMENTS

| | | | |
|---|---|---|---|
| 5,508,212 | * | 4/1996 | Wang et al. ............................ 437/24 |
| 5,545,592 | * | 8/1996 | Iacoponi ............................... 437/200 |
| 5,656,546 | * | 8/1997 | Chen et al. ........................... 438/586 |
| 6,027,990 | * | 2/2000 | Thakur et al. ........................ 438/533 |
| 6,124,202 | * | 9/2000 | Jeon et al. ............................ 438/649 |
| 6,156,644 | * | 12/2000 | Ko et al. .............................. 438/639 |

OTHER PUBLICATIONS

Naem et al, Jul. 15, 1994, J. Appl. Phys., 76 (2), 1071–1076.*
Choi et al, Jul. 1, 1992, J. Appl Phys., 72 (1), 297–299.*
Byun et al, Aug. 1, 1995, J. Appl. Phys., 78 (3), 1725–1730.*
Zhu et al, Jul. 15, 1995, J. Appl. Phys., 77 (12), 6257–6262.*
Saenger et al, Dec. 15, 1995, J. Appl. Phys., 78 (12), 7040–7044.*
Tsui et al, Aug. 1, 1994, J. Appl. Phys., 76 (3), 1995–1997.*

* cited by examiner

Primary Examiner—Tom Thomas
Assistant Examiner—Donghee Kang
(74) Attorney, Agent, or Firm—Schwegman, Lundberg, Woessner & Xluth, P.A.

(57) ABSTRACT

A method for lowering the anneal temperature required to form a multi-component material, such as refractory metal silicide. A shallow layer of titanium is implanted in the bottom of the contact area after the contact area is defined. Titanium is then deposited over the contact area and annealed, forming titanium silicide. A second embodiment comprises depositing titanium over a defined contact area. Silicon is then implanted in the deposited titanium layer and annealed, forming titanium silicide. A third embodiment comprises combining the methods of the first and second embodiments. In further embodiment, nitrogen, cobalt, cesium, hydrogen, fluorine, and deuterium are also implanted at selected times.

65 Claims, 5 Drawing Sheets

USING IMPLANTS TO LOWER ANNEAL TEMPERATURES

This application is a divisional of U.S. Ser. No. 09/131,453 filed Aug. 10, 1998 which is a divisional of U.S. Ser. No. 08/676,587 filed Jul. 8, 1996.

FIELD OF THE INVENTION

The present invention relates to methods for forming semiconductor device interconnects and, in particular, to a method for forming refractory metal silicide at a metal/semiconductor interface.

BACKGROUND OF THE INVENTION

Contacts between metal and semiconductor active areas are currently improved by forming a refractory metal silicide at the interface between the two materials. Titanium silicide is the most commonly used silicide. Titanium is deposited or sputtered on the semiconductor active area and annealed to form titanium silicide. This provides a good, low resistance contact.

Borophosphosilicate glass (BPSG) is used as a device insulator, surrounding contact areas. Recently, in order to get BPSG to reflow at lower temperatures, the amount of dopants in the BPSG film is being increased. It is desirable to lower the reflow temperature of BPSG to avoid diffusion of dopants into undesired areas during high temperature steps. Normally, reflow temperatures exceed those required during annealing process steps. However, the addition of dopants causes BPSG to reflow even at the temperatures required for the titanium anneal process. This is undesirable because it causes titanium to buckle, resulting in degradation of contacts by increasing their resistance. This is counter-productive to the main reason for forming titanium silicide at semiconductor/metal interfaces—to improve contacts by lowering their resistance.

The addition of a refractory metal nitride layer at the surface of the refractory metal silicide provides both a barrier to diffusion into the contact, and helps with the adhesion of the refractory metal silicide to the metal, which may comprise tungsten, aluminum, and similar conductive metals. Conventionally, such layers are formed by annealing in a nitrogen-containing ambient simultaneously with forming refractory metal silicide because it is important that a barrier nitride layer form simultaneously with titanium silicide, so that both can be formed in one processing step. Typically, titanium silicide is used for the refractory metal silicide and titanium nitride is used for the barrier layer.

As devices are becoming smaller, there is a need for lowering the temperature at which the refractory metal anneal occurs when forming refractory metal silicide at semiconductor/metal interfaces. In smaller devices, the acceptable amount of thermal-induced dopant diffusion is lower. There is a further need for lowering the temperature at which refractory metal nitride is formed in order that the refractory metal nitride layer can be formed simultaneously with the refractory metal silicide layer. It is paramount that the temperature of these anneals be lowered so that low temperature reflow doped oxide insulator layers can be used.

SUMMARY OF THE INVENTION

A method for lowering the anneal temperature required to form a multicomponent material, such as refractory metal silicide, is described. The method is described with reference to the most common refractory metal silicide, titanium silicide, and a typical insulator material such as borophosphosilicate glass (BPSG) or other suitable insulative material. Insulator materials are deposited prior to depositing refractory metals and subsequently annealing to form silicide. Lowering the anneal temperature prevents the BPSG insulator film from reflowing at undesired times, which, if not prevented, causes titanium buckling. The invention is applicable to other semiconductor structures, which do not comprise BPSG as an insulator film, such as those using a doped oxide insulating film. One advantage of the invention is that lower processing temperatures prevent unwanted dopant diffusion at higher temperatures, which is a limiting factor in the manufacture of small devices.

In one embodiment of the invention, a shallow layer of a refractory metal, such as titanium, is implanted in the bottom of a defined contact area, such as a contact hole defined over a silicon substrate. The refractory metal is then deposited over the contact area and annealed, forming a refractory metal silicide in the area where the refractory metal is implanted. Due to the increased concentration of refractory metal in the contact area, annealing is performed at lower temperatures due to the decreased diffusion lengths of silicon/refractory metal required to form the contact.

In a second embodiment of the invention, after a contact area is defined, a refractory metal is deposited over the contact area Silicon is then implanted in the deposited refractory metal layer. Annealing causes refractory metal silicide to form in the region where the refractory metal is deposited, in contact with the underlying silicon substrate.

In a third embodiment of the invention, the previous two embodiments are combined. A shallow layer of a refractory metal, such as titanium, is implanted in the bottom of a defined contact area, such as a contact hole defined over a silicon substrate. The refractory metal is then deposited over the contact area. Silicon is then implanted in the deposited refractory metal layer. Annealing causes refractory metal silicide to form in the region where the refractory metal is deposited and implanted, in contact with the underlying silicon substrate.

In a further embodiment of the invention, an additional step comprises implanting nitrogen over the deposited refractory metal layer prior to the anneal step. Refractory metal nitride is then formed simultaneously with refractory metal silicide during the anneal step. In yet a further embodiment, nitrogen is implanted subsequent to annealing to form a refractory metal silicide. The nitrogen implant lowers the temperature at which the refractory metal nitride is formed by decreasing the nitrogen/refractory metal diffusion lengths required to form the nitride layer. Refractory metal nitride helps provide a barrier to unwanted diffusion into the contact.

In yet a further embodiment of the invention, an additional step comprises implanting an element selected from the group consisting of: cobalt, cesium, hydrogen, fluorine, and deuterium in the bottom of the contact area, prior to implanting a refractory metal. In still another embodiment, an element selected from the group consisting of: cobalt, cesium, hydrogen, fluorine, and deuterium is implanted in the deposited titanium layer, prior to implanting silicon therein. In still another embodiment, an element selected from the group consisting of: cobalt, cesium, hydrogen, fluorine, and deuterium is implanted in the refractory metal silicide layer subsequent to the anneal step and prior to subsequent process steps. The addition of such an implant further defines grain structure and lowers the temperature needed to form the refractory metal silicide layer when it is performed prior to the anneal step, which forms the silicide.

Description of the Embodiments

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures.

A method for lowering the anneal temperature required to form a multicomponent material, such as refractory metal silicide, is described. The method is described with reference to the most common refractory metal silicide, titanium silicide, and a typical insulator material such as borophosphosilicate glass (BPSG) or other suitable insulative material. Insulator materials are deposited prior to depositing refractory metals and subsequently annealing to form silicide. Lowering the anneal temperature prevents the BPSG insulator film from reflowing at undesired times, which, if not prevented, causes titanium buckling. The invention is applicable to other semiconductor structures, which do not comprise BPSG as an insulator film, such as those using a doped oxide insulating film. One advantage of the invention is that lower processing temperatures prevent unwanted dopant diffusion at higher temperatures, which is a limiting factor in the manufacture of small devices. In this invention, the refractory metal used to form the silicide can be any refractory metal, such as titanium, tungsten, tantalum, cobalt, and molybdenum.

Figure 1:
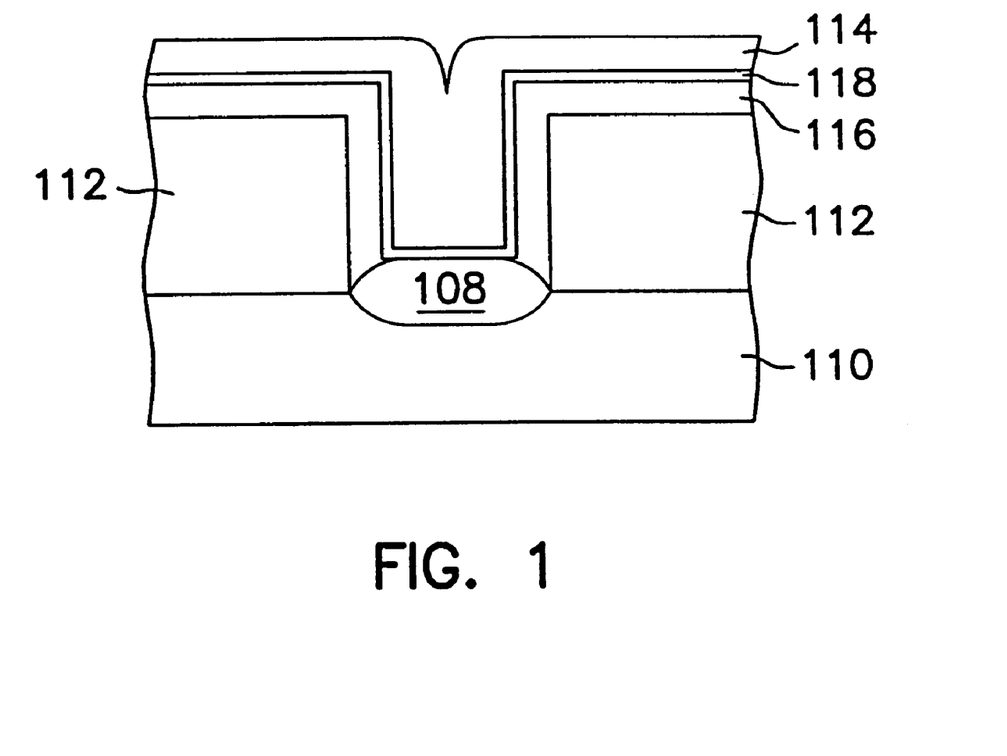
FIG. 1 is a cross-sectional representation illustrating a typical semiconductor interconnect.

As shown in FIG. 1, refractory metal silicide 108 is formed in accordance with the method of the invention to decrease the ohmic resistance of a contact hole interconnect. A contact hole is defined by a silicon substrate 110, on the bottom, and an insulator material, 112, on the sides. The dimensions of the hole are not critical to the practice of the invention In fact, the invention can be applied to planar surfaces as well as recesses in a semiconductor substrate. Prior to depositing metal 114 in the contact hole, respective layers of refractory metal silicide 116 and refractory metal nitride 118 are formed in the contact hole. Subsequently, metal 114, such as tungsten or aluminum, is deposited in the contact hole to form a low resistance interconnect.

Figure 2A:
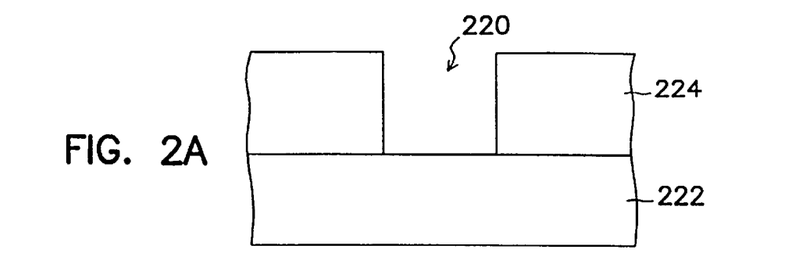
FIGS. 2a,b,c,d are cross-sectional representations illustrating one embodiment of the present invention, where a refractory metal is implanted in the contact area before refractory metal deposition, to form refractory metal silicide.

In one embodiment of the invention, titanium silicide is formed in a contact hole by implanting titanium and annealing, as shown in FIGS. 2a–2d. As shown in FIG. 2a, a contact hole 220 is defined, using conventional techniques. The dimensions of the hole are not critical to the invention. The contact hole 220 is defined by a silicon substrate 222 on the bottom and BPSG sidewalls 224. The silicon substrate is comprised of single crystal silicon, in order that the implant energy and anneal temperatures need not be as high, as implanted ions can easily diffuse through such a crystalline structure. However, the scope of the invention is not limited to single crystal silicon substrates.

Figure 2B:
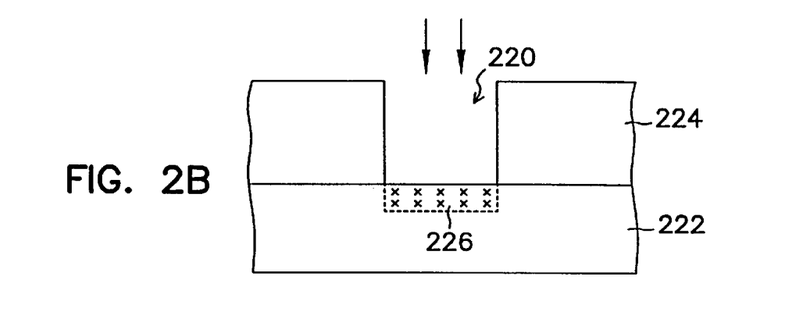

Next, a shallow layer of titanium is implanted into the bottom of the contact area, as shown in FIG. 2b, to form an implanted region 226. The depth of the implanted region 226 is between approximately 20 to 300 angstroms. The depth of the implanted region 226 is dependent on many parameters, such as: the desired thickness of the multi-component material formed, the type of implant ion, the target material, the implant energy, and whether the target material is oriented such that channeling occurs. All of these parameters are easily selectable by one of average skill in the art.

Figure 2C:
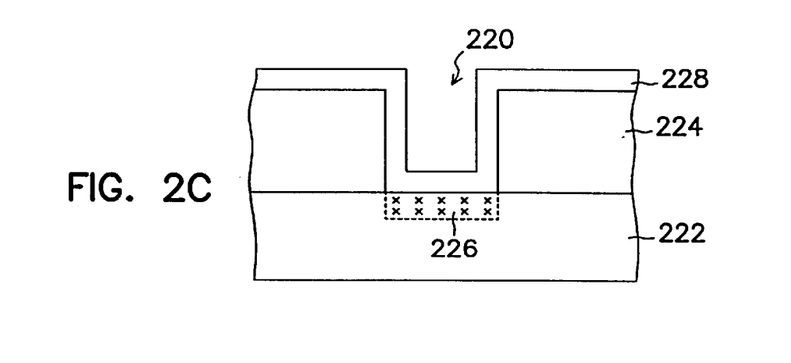

A titanium layer 228 is then deposited or sputtered over the contact area, as shown in FIG. 2c. The depth of the titanium layer 228 is between approximately 150 to 1,500 angstroms. The depth of the titanium layer 228 is dependent on the desired thickness of the multi-component material formed, and the depth of the implanted region 226.

Figure 2D:
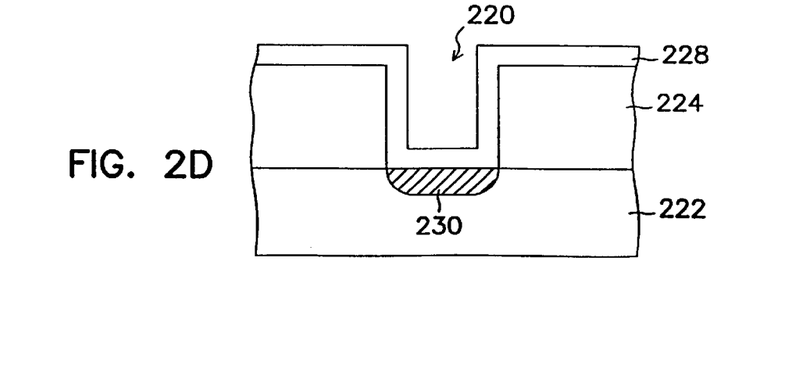

Subsequently, the structure is annealed for at least approximately 5 seconds, forming titanium silicide 230 in the area where the titanium is implanted, as shown in FIG. 2d. The thickness of the titanium silicide layer 230 formed is between approximately 20 to 800 angstroms. The annealing temperature depends on many parameters, including the amount and depth of ions implanted into the silicon substrate, the amount of implant damage to the substrate, the desired thickness of the multicomponent material formed, and the type of implant ion. In the formation of titanium silicide, due to the increased concentration of titanium in the contact area, annealing can be performed at lower temperatures, such as between 500 to 950 degrees Celsius, because the diffusion lengths of silicon/titanium are decreased (i.e., each constituent in the multi-component compound does not have to travel as far to react with the other component).

In a further embodiment, an additional step comprises implanting an element selected from the group consisting of: cobalt, cesium, hydrogen, fluorine, and deuterium in the bottom of the contact area, prior to implanting the refractory metal in the semiconductor substrate. In yet another embodiment, an element selected from the group consisting of: cobalt, cesium, hydrogen, fluorine, and deuterium is implanted in the refractory metal silicide layer subsequent to the anneal step and prior to subsequent definition steps. The concentration of the additional implanted element depends on the aspect ratio (ratio of height to diameter) of the hole, among other parameters. As the aspect ratio of a hole increases, the concentration of dopants required increases. The addition of such an implant further defines grain structure and lowers the temperature needed to form the refractory metal silicide layer when performed prior to the anneal step, which forms the silicide.

Figure 3A:
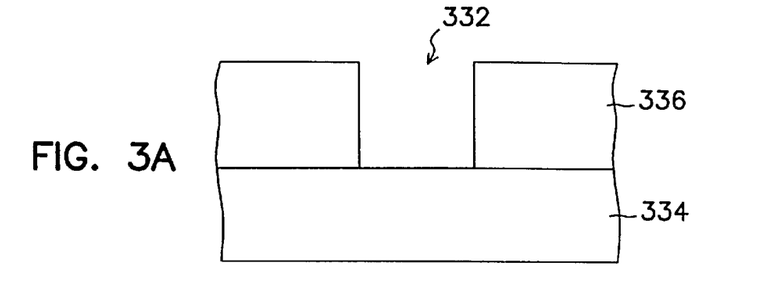
FIGS. 3a,b,c,d are cross-sectional representations illustrating another embodiment of the present invention, where silicon is implanted in the contact area after refractory metal deposition, to form refractory metal silicide.

In a second embodiment of the invention, titanium silicide is formed in a contact hole 332 by implanting silicon in a titanium layer 338 and annealing, as shown in FIGS. 3a–3d. As shown in FIG. 3a, a contact hole 332 is defined, using conventional techniques. The dimensions of the hole 332 are not critical to the invention. The contact hole 332 is defined by a silicon substrate 334 on the bottom and BPSG sidewalls 336. The silicon substrate is comprised of single crystal silicon, in order that the implant energy and anneal temperatures need not be as high, as implanted ions can easily diffuse through such a crystalline structure. However, the scope of the invention is not limited to single crystal silicon substrates.

Figure 3B:
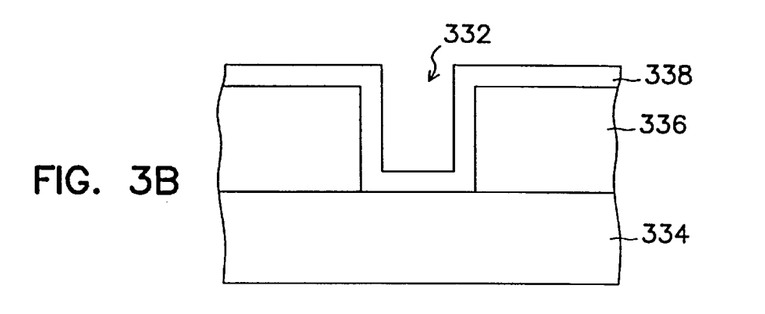
Figure 3C:
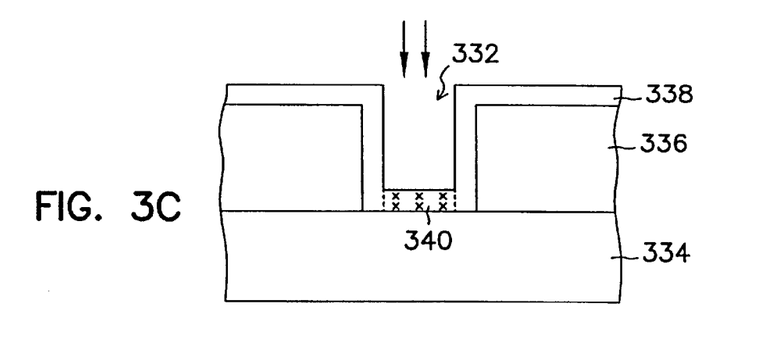

A titanium layer 338 is deposited or sputtered over the contact area, as shown in FIG. 3b, to a depth of between approximately 150 to 1,500 angstroms. The depth of the layer 338 is dependent on the desired thickness of the multi-component material formed. Next, silicon is implanted into the titanium layer at the bottom of the contact hole, to form a silicon-rich region 340, as shown in FIG. 3c, throughout the area of the deposited titanium layer. The depth of the implanted region 340 is dependent on many parameters, such as the desired thickness of the multi-component material formed, the type of implant ion, the target material, and the implant energy. All of these parameters are easily selectable by one of ordinary skill in the art.

Figure 3D:
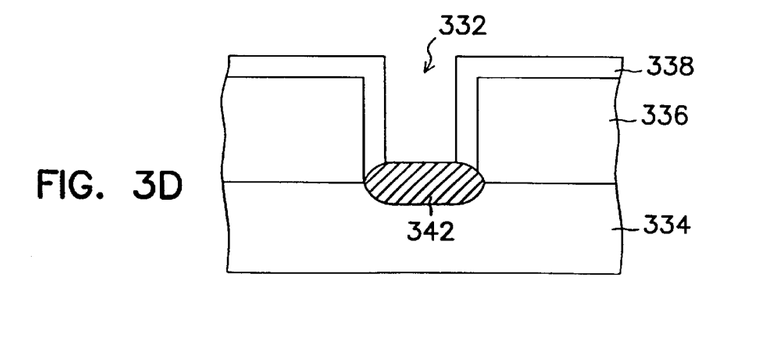

Subsequently, the structure is annealed for at least approximately 5 seconds, forming titanium silicide 342 at the silicon/titanium interface, as shown in FIG. 3d, having a thickness of between approximately 20 to 1,500 angstroms. The anneal temperature is between approximately 500 to 950 degrees Celsius. The anneal temperature depends on many parameters, including: the amount and depth of ions implanted into the deposited material, the amount of implant damage to the deposited material, the desired thickness of the multi-component material formed, and the type of implant ion. Due to the increased concentration of silicon in the titanium at the bottom of the contact area, annealing can be performed at lower temperatures because the diffusion lengths of silicon/titanium are decreased (i.e., each constituent in the multi-component compound does not have to travel as far to react with the other component).

In a further embodiment, an element selected from the group consisting of: cobalt, cesium, hydrogen, fluorine, and deuterium is implanted in the deposited titanium layer, prior to implanting silicon therein. In yet another embodiment, an element selected from the group consisting of: cobalt, cesium, hydrogen, fluorine, and deuterium is implanted in the refractory metal silicide layer subsequent to the anneal step and prior to subsequent definition steps. The concentration of the additional implanted element depends on the aspect ratio (ratio of height to diameter) of the hole, among other parameters. As the aspect ratio of a hole increases, the concentration of dopants required increases. The addition of such an implant further defines grain structure and lowers the temperature needed to form the refractory metal silicide layer when performed prior to the anneal step, which forms the silicide.

Figure 4A:
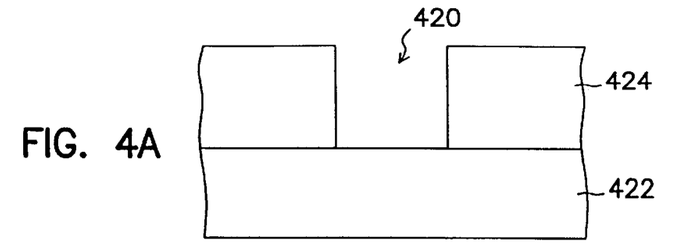
FIGS. 4a,b,c,d,e are cross-sectional representations illustrating another embodiment of the present invention, where a refractory metal is implanted in the contact area before refractory metal deposition, and where silicon is implanted in the contact area after refractory metal deposition; to form refractory metal silicide.

In a third embodiment of the invention, the previous two embodiments are combined. Titanium silicide is formed in a contact hole by implanting titanium and annealing, as shown in FIGS. 4a–4e. As shown in FIG. 4a, a contact hole 420 is defined, using conventional techniques. The dimensions of the hole are not critical to the invention. The contact hole 420 is defined by a silicon substrate 422 on the bottom and BPSG sidewalls 424. The silicon substrate is comprised of single crystal silicon, in order that the implant energy and anneal temperatures need not be as high, as implanted ions can easily diffuse through such a crystalline structure. However, the scope of the invention is not limited to single crystal silicon substrates.

Figure 4B:
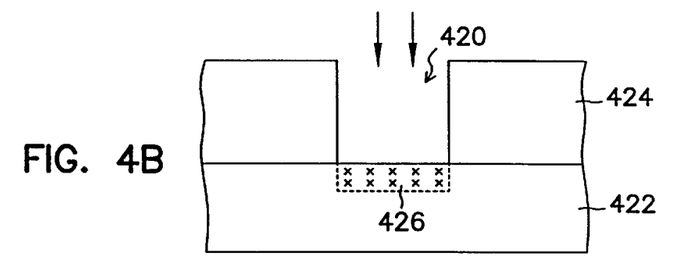

Next, a shallow layer of titanium is implanted into the bottom of the contact area, as shown in FIG. 4b, to form an implanted region 426. The depth of the implanted region 426 is between approximately 20 to 300 angstroms. The depth of the implanted region 426 is dependent on many parameters, such as: the desired thickness of the multi-component material formed, the type of implant ion, the target material, the implant energy, and whether the target material is oriented such that channeling occurs. All of these parameters are easily selectable by one of average skill in the art.

Figure 4C:
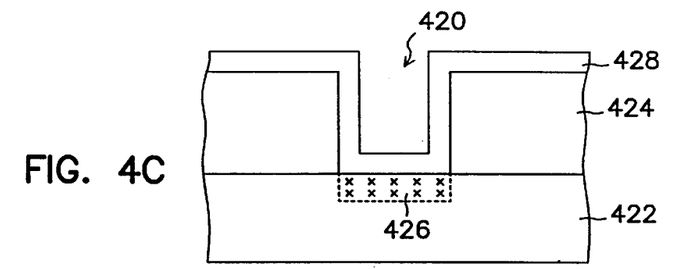

A titanium layer 428 is then deposited or sputtered over the contact area, as shown in FIG. 4c. The depth of the titanium layer 228 is between approximately 150 to 1,500 angstroms. The depth of the layer 228 is dependent on the desired thickness of the multi-component material formed, and the depth of the implanted region 226.

Figure 4D:
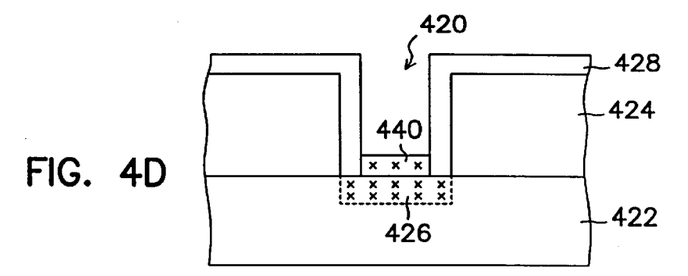
Figure 4E:
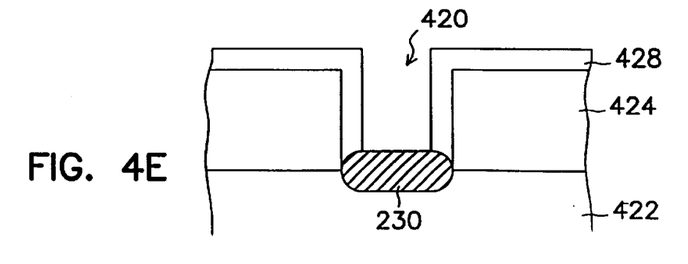

Next, silicon is implanted into the titanium layer at the bottom of the contact hole, to form a silicon-rich region 440, as shown in FIG. 4d, throughout the area of the deposited titanium layer 428. The depth of the implanted region 440 is dependent on many parameters, such as the desired thickness of the multi-component material formed, the type of implant ion, the target material, and the implant energy. All of these parameters are easily selectable by one of ordinary skill in the arL Subsequently, the structure is annealed for at least 5 seconds, forming titanium silicide 430 in the areas where the titanium and silicon are implanted, as shown in FIG. 4e. The thickness of the titanium silicide layer 430 formed is between approximately 20 to 1,500 angstroms. The annealing temperature depends on many parameters, including: the amount and depth of ions implanted into the silicon substrate, the amount of implant damage to the substrate, the desired thickness of the multi-component material formed, and the type of implant ion. In the formation of titanium silicide, due to the increased concentration of titanium in the contact area, annealing can be performed at lower temperatures, such as between 500 to 950 degrees Celsius, because the diffusion lengths of silicon/titanium are decreased (i.e., each constituent in the multi-component compound does not have to travel as far to react with the other component).

In a further embodiment, an additional step comprises implanting an element selected from the group consisting of: cobalt, cesium, hydrogen, fluorine, and deuterium in the bottom of the contact area, prior to implanting the refractory metal in the semiconductor substrate. In yet a further embodiment, an element selected from the group consisting of: cobalt, cesium, hydrogen, fluorine, and deuterium is implanted in the deposited titanium layer, prior to implanting silicon therein. In yet another embodiment, an element selected from the group consisting of: cobalt, cesium, hydrogen, fluorine, and deuterium is implanted in the refractory metal silicide layer subsequent to the anneal step and prior to subsequent definition steps. The concentration of the additional implanted element depends on the aspect ratio (ratio of height to diameter) of the hole, among other parameters. As the aspect ratio of a hole increases, the concentration of dopants required increases. The addition of such an implant further defines grain structure and lowers the temperature needed to form the refractory metal silicide layer when performed prior to the anneal step, which forms the silicide.

Figure 5A:
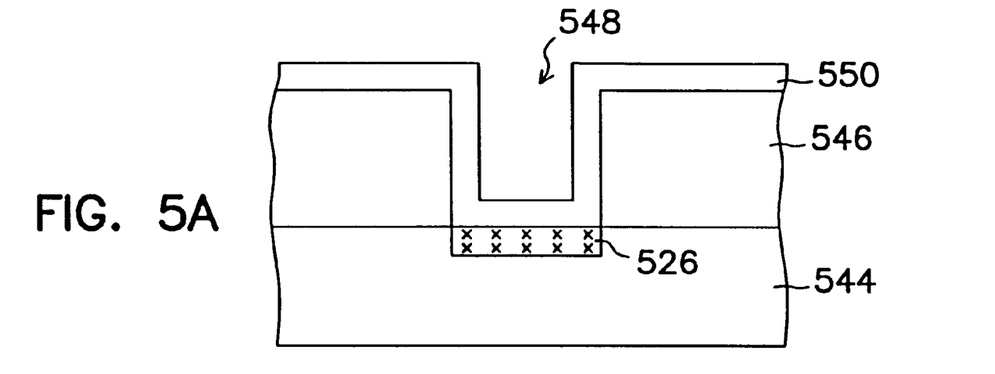
FIGS. 5a,b,c are cross-sectional representations illustrating another embodiment of the present invention, where nitrogen is implanted in the deposited refractory metal, to form refractory metal nitride.
Figure 5B:
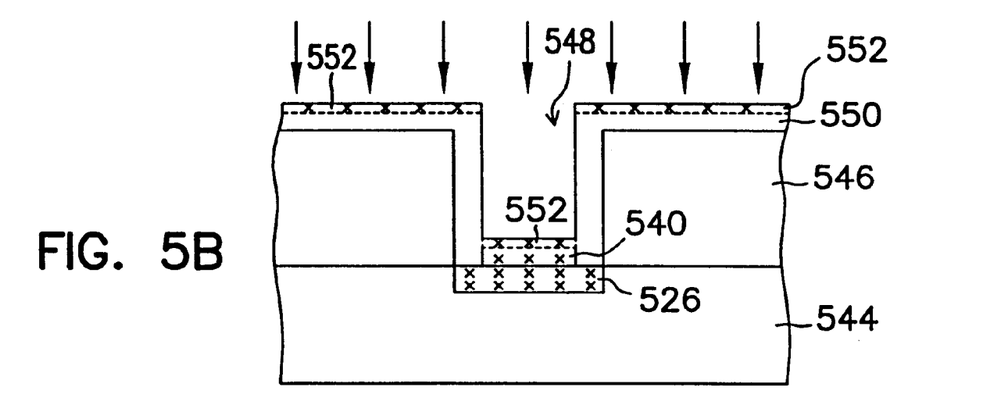
Figure 5C:
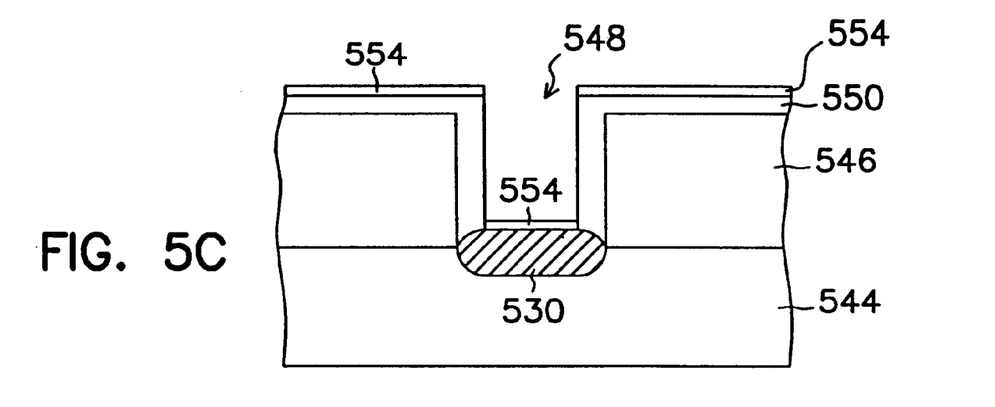

In a further embodiment of the invention, a titanium nitride layer is formed on the deposited titanium layer, as shown in FIGS. 5a–5c, simultaneously with formation of the titanium silicide layer. For example, after titanium is implanted in a silicon substrate 544 at the bottom of a contact hole 548 having sides of insulating material 546 to form implanted region 526, a layer of titanium 550, having a thickness of between approximately 150 to 1,500 angstroms, is then deposited over the structure, as shown in FIG. 5a. The depth of the layer 550 is dependent on the desired thickness of the multi-component material formed. Silicon is then implanted in the deposited titanium layer 550, to form a silicon-rich region 540 and nitrogen is implanted into the deposited titanium layer 550 prior to the anneal step, to form nitrogen-rich regions 552, as shown in FIG. 5b. The depth of the implanted region 552 is approximately between 20 to 300 angstroms. The depth of the implanted region 552 is dependent on many parameters, such as: the desired thickness of the nitride layer formed and the implant energy. All of these parameters are easily selectable by one of average skill in the art.

Titanium nitride 554 is then formed during the anneal step, simultaneously with formation of titanium silicide 530, as shown in FIG. 5c. The anneal temperature ranges from between approximately 500 to 950 degrees Celsius. The nitrogen implant provides a reduction in the temperature at which the titanium nitride is formed by decreasing the nitrogen/titanium diffusion lengths (i.e., each constituent in the multi-component compound does not have to travel as far to react with the other component). It is critical to employ this aspect of the invention when forming titanium silicide in accordance with one of the embodiments of the invention because the temperature is lowered during the annealing step. Using conventional techniques to form a nitride layer 554, by annealing in a nitrogen ambient alone, does not provide a nitride layer 554 of the desired thickness at decreased processing temperatures. This aspect of the invention is applicable to other embodiments of the invention as well.

When forming a titanium nitride layer in accordance with this further embodiment of the invention, annealing in a nitrogen ambient is not required. However, annealing in a nitrogen ambient in combination with this aspect of the invention further increases the rate of formation of titanium nitride for a given temperature. Furthermore, this allows formation of titanium nitride 118 on the sidewalls of a contact wall also, as shown in FIG. 1, rather than only in selectively-implanted areas, as illustrated in FIGS. 5a–5c. However, nitrogen can also be implanted at an angle, so that the sidewalls of a contact hole form titanium nitride 118 during subsequent anneal steps, without the necessity of annealing in a nitrogen ambient. The angle of implant is adjusted, as well known to one skilled in the art, to achieve the desired depth of implant on the contact hole sidewalls. Adjusting the angle between approximately 0 and 50 degrees provides this variability in implant depth. It is preferable, however, to have an implant angle of approximately 27 degrees for a typical contact hole.

In yet a further embodiment, a titanium nitride layer is formed after formation of the titanium silicide layer. The same process steps as described previously are followed. The anneal step will not simultaneously form titanium silicide, however.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A semiconductor structure, comprising:
   a substrate; and
   a layer of material formed on the substrate, wherein the layer of material comprises refractory metal silicide and an implanted element selected from the group consisting of cobalt, cesium and deuterium, further wherein the layer of material is formed by a method comprising:
   forming a layer of refractory metal on the substrate;
   implanting silicon into the layer of refractory metal, to form an implanted region;
   annealing to form the refractory metal silicide; and
   implanting an element selected from the group consisting of cobalt, cesium and deuterium into the layer of refractory metal.

2. The semiconductor structure of claim 1, wherein the refractory metal is selected from the group consisting of titanium, tungsten, tantalum, cobalt and molybdenum.

3. The semiconductor structure of claim 1, wherein annealing to form the refractory metal silicide comprises annealing at a temperature of between approximately 500 to 950 degrees Celsius for at least approximately 5 seconds.

4. The semiconductor structure of claim 1, wherein the implanted element is implanted at a time selected from the group consisting of the times of prior to implanting the silicon and subsequent to annealing.

5. The semiconductor structure of claim 1, wherein the layer of material further comprises refractory metal nitride, and the method of forming the layer of material further comprises implanting nitrogen into the implanted region at a time selected from the group consisting of prior to annealing and subsequent to annealing.

6. The semiconductor structure of claim 1, wherein the implanted element is implanted into the layer of refractory metal prior to implanting the silicon therein.

7. The semiconductor structure of claim 1, wherein the implanted element is implanted into the layer of refractory metal subsequent to annealing.

8. A semiconductor structure, comprising:
   a substrate; and
   a layer containing at least two compounds and an implanted element selected from the group consisting of cobalt, cesium and deuterium formed on the substrate, wherein the layer containing the at least two compounds and the implanted element is formed by a method comprising:
   forming a layer of material, comprising a first element, on the substrate;
   implanting a second element into the layer of material, to form a first implanted region;
   implanting a third element into the layer of material, to form a second implanted region;
   annealing to form the at least two compounds, the first compound comprising at least the first and second elements, and the second compound comprising at least the first and third elements; and
   implanting an element selected from the group consisting of cobalt, cesium, and deuterium at a time selected from the group consisting of the times of prior to implanting the second element, prior to implanting the third element, and subsequent to annealing.

9. The semiconductor structure of claim 8, wherein the first element comprises a refractory metal selected from the group consisting of titanium, tungsten, tantalum and molybdenum.

10. The semiconductor structure of claim 8, wherein the second element comprises silicon.

11. The semiconductor structure of claim 8, wherein the third element comprises nitrogen.

12. The semiconductor structure of claim 8, wherein annealing comprises annealing in a nitrogen-containing ambient.

13. The semiconductor structure of claim 8, wherein the implanted element is implanted into the first compound subsequent to annealing.

14. The semiconductor structure of claim 8, wherein the implanted element is implanted into the layer of material prior to implanting the second element therein.

15. The semiconductor structure of claim 8, wherein the implanted element is implanted into the layer of material prior to implanting the third element therein.

16. A semiconductor structure, comprising:
    a substrate; and
    a layer of material formed on the substrate, wherein the layer of material comprises titanium silicide and an implanted element selected from the group consisting of cobalt, cesium and deuterium, further wherein the layer of material is formed by a method comprising:
        forming a titanium layer on the substrate;
        implanting silicon into the titanium layer to form an implanted region; annealing to form the titanium silicide; and
        implanting an element selected from the group consisting of cobalt, cesium and deuterium at a time selected from the group consisting of the times of prior to implanting the silicon and subsequent to annealing.

17. The semiconductor structure of claim 16, wherein forming a titanium layer on the substrate comprises forming a titanium layer on a bottom of a contact hole.

18. The semiconductor structure of claim 17, wherein the contact hole further has sides defined by an insulator material selected from the group consisting of borophosphosilicate glass and doped oxides.

19. The semiconductor structure of claim 16, wherein the layer of material further comprises titanium nitride, and the method of forming the layer of material further comprises implanting nitrogen into the titanium layer at a time selected from the group consisting of the times of prior to annealing and subsequent to annealing.

20. The semiconductor structure of claim 16, wherein the implanted element is implanted into the titanium silicide.

21. The semiconductor structure of claim 16, wherein the implanted element is implanted into the titanium layer prior to implanting the silicon.

22. A semiconductor device interconnect, comprising:
    a contact hole, wherein the contact hole has a substantially horizontal bottom and substantially vertical sides; and
    a layer of material formed on the bottom of the contact hole, wherein the layer of material comprises a layer of refractory metal silicide, a layer of refractory metal nitride on the layer of refractory metal silicide, and an implanted element selected from the group of cobalt, cesium and deuterium, further wherein the layer of material is formed by a method comprising:
        forming a refractory metal layer on the bottom of the contact hole;
        implanting silicon into the refractory metal layer to form an implanted region;
        annealing to form refractory metal silicide;
        implanting nitrogen into the refractory metal layer at a time selected from the group consisting of the times of prior to annealing and subsequent to annealing, wherein the nitrogen is implanted at an angle of approximately 0 to 50 degrees from a plane perpendicular to the bottom of the contact hole; and
        implanting an element selected from the group consisting of cobalt, cesium and deuterium at a time selected from the group consisting of the times of prior to implanting the silicon, prior to implanting the nitrogen, and subsequent to annealing.

23. A semiconductor device interconnect, comprising:
    a contact hole, wherein the contact hole has a substantially horizontal bottom and substantially vertical sides; and
    a layer of material formed on the bottom of the contact hole, wherein the layer of material comprises a layer of titanium silicide, a layer of titanium nitride on the layer of titanium silicide, and an implanted element selected from the group consisting of cobalt, cesium, and deuterium, further wherein the layer of material is formed by a method comprising:
        forming a titanium layer on the bottom of the contact hole;
        implanting silicon into the titanium layer to form an implanted region;
        annealing to form titanium silicide;
        implanting nitrogen into the titanium layer at a time selected from the group consisting of the times of prior to annealing and subsequent to annealing, wherein the nitrogen is implanted at an angle of approximately 0 to 50 degrees from a plane perpendicular to the bottom of the contact hole; and
        implanting an element selected from the group consisting of cobalt, cesium and deuterium at a time selected from the group consisting of the times of prior to implanting the silicon, prior to implanting the nitrogen, and subsequent to annealing.

24. A semiconductor structure, comprising:
    a substrate; and
    a layer of material formed on the substrate, wherein the layer of material comprises refractory metal silicide and an implanted element selected from the group consisting of cobalt, cesium and deuterium, further wherein the layer of material is formed by a method comprising:
        implanting a refractory metal in a substrate;
        forming a layer of the refractory metal on the substrate;
        annealing to form the refractory metal silicide; and
        implanting an element selected from the group consisting of cobalt, cesium and deuterium at a time selected from the group consisting of the times of prior to implanting the refractory metal and subsequent to annealing.

25. The semiconductor structure of claim 24, wherein the refractory metal is selected from the group consisting of titanium, tungsten, tantalum, cobalt and molybdenum.

26. The semiconductor structure of claim 24, wherein the implanted element is implanted into the refractory metal silicide.

27. The semiconductor structure of claim 24, wherein the layer of material also comprises refractory metal nitride, and the method of forming the layer of material further comprises implanting nitrogen into the layer of the refractory metal at a time selected from the group consisting of prior to annealing and subsequent to annealing.

28. The semiconductor structure of claim 24, wherein the implanted element is implanted into the substrate prior to implanting the refractory metal therein.

29. A semiconductor structure, comprising:
a substrate; and
a layer of material formed on the substrate, wherein the layer of material comprises refractory metal silicide and an implanted element selected from the group consisting of cobalt, cesium and deuterium, further wherein the layer of material is formed by a method comprising:
implanting a refractory metal in a substrate;
forming a layer of the refractory metal on the substrate;
implanting silicon in the layer of the refractory metal;
annealing to form the refractory metal silicide; and
implanting an element selected from the group consisting of cobalt, cesium and deuterium at a time selected from the group consisting of prior to implanting the refractory metal, prior to implanting the silicon and subsequent to annealing.

30. The semiconductor structure of claim 29, wherein the refractory metal is selected form the group consisting of titanium, tungsten, tantalum, cobalt and molybdenum.

31. The semiconductor structure of claim 29, wherein the implanted element is implanted into the refractory metal silicide.

32. The semiconductor structure of claim 29, wherein the layer of material also comprises refractory metal nitride, and the method of forming the layer of material further comprises implanting nitrogen into the layer of the refractory metal at a time selected from the group consisting of prior to annealing and subsequent to annealing.

33. The semiconductor structure of claim 29, wherein the implanted element is implanted into the substrate prior to implanting the refractory metal therein.

34. The semiconductor structure of claim 29, wherein the implanted element is implanted into the layer of the refractory metal prior to implanting the silicon therein.

35. A semiconductor structure, comprising:
a substrate; and
a layer containing at least two compounds and an implanted element selected from the group consisting of cobalt, cesium and deuterium formed on the substrate, wherein the layer containing the at least two compounds and the implanted element is formed by a method comprising:
implanting a first element into the substrate;
forming a layer of material, comprising the first element, on the substrate;
implanting a second element into the layer of material, to form a first implanted region;
implanting a third element into the layer of material, to form a second implanted region;
annealing to form the at least two compounds, the first compound comprising at least the first and second elements, and the second compound comprising at least the first and third elements; and
implanting an element selected from the group consisting of cobalt, cesium and deuterium at a time selected from the group consisting of the times of prior to implanting the second element, prior to implanting the third element, and subsequent to annealing.

36. The semiconductor structure of claim 35, wherein the first element comprises a refractory metal selected from the group consisting of titanium, tungsten, tantalum and molybdenum.

37. The semiconductor structure of claim 35, wherein the second element comprises silicon.

38. The semiconductor structure of claim 35, wherein the third element comprises nitrogen.

39. The semiconductor structure of claim 35, wherein annealing comprises annealing in a nitrogen-containing ambient.

40. The semiconductor structure of claim 35, wherein the implanted element is implanted into the first compound.

41. The semiconductor structure of claim 35, wherein the implanted element is implanted into the layer of material prior to implanting the second element therein.

42. The semiconductor structure of claim 35, wherein the implanted element is implanted into the layer of material prior to implanting the third element therein.

43. A semiconductor structure, comprising:
a substrate; and
a layer of material formed on the substrate, wherein the layer of material comprises titanium silicide and an implanted element selected from the group consisting of cobalt, cesium and deuterium, further wherein the layer of material is formed by a method comprising:
implanting titanium into the substrate;
forming a titanium layer on the substrate;
implanting silicon into the titanium layer;
annealing to form titanium silicide; and
implanting an element selected from the group consisting of cobalt, cesium and deuterium at a time selected from the group consisting of the times of prior to implanting the titanium, prior to implanting the silicon and subsequent to annealing.

44. The semiconductor structure of claim 43, wherein forming a titanium layer on the substrate comprises forming a titanium layer on a bottom of a contact hole.

45. The semiconductor structure of claim 43, wherein the contact hole further has sides defined by an insulator material selected from the group consisting of borophosphosilicate glass and doped oxides.

46. The semiconductor structure of claim 43, wherein the layer of material further comprises titanium nitride, and the method of forming the layer of material further comprises implanting nitrogen into the titanium layer at a time selected from the group consisting of the times of prior to annealing and subsequent to annealing.

47. A semiconductor structure, comprising:
a substrate; and
a layer of material formed on the substrate, wherein the layer of material comprises refractory metal silicide and an implanted element selected from the group consisting of cobalt, cesium and deuterium, further wherein the layer of material is formed by a method comprising:
implanting a refractory metal in a substrate;
forming a layer of the refractory metal on the substrate;
annealing to form the refractory metal silicide;
implanting nitrogen into the layer of refractory metal at a time selected from the group consisting of prior to annealing and subsequent to annealing; and
implanting an element selected from the group consisting of cobalt, cesium and deuterium at a time selected from the group consisting of the times of prior to implanting the refractory metal, prior to implanting the nitrogen, and subsequent to annealing.

48. The semiconductor structure of claim 47, wherein the refractory metal is selected from the group consisting of titanium, tungsten, tantalum, cobalt and molybdenum.

49. The semiconductor structure of claim 47, wherein the implanted element is implanted into the refractory metal silicide.

50. A semiconductor structure, comprising:
a substrate; and
a layer of material formed on the substrate, wherein the layer of material comprises refractory metal silicide and an implanted element selected from the group consisting of cobalt, cesium and deuterium, further wherein the layer of material is formed by a method comprising:
implanting a refractory metal in a substrate;
forming a layer of the refractory metal on the substrate;
implanting silicon in the layer of the refractory metal;
annealing to form the refractory metal silicide;
implanting nitrogen into the layer of the refractory metal at a time selected from the group consisting of prior to annealing and subsequent to annealing; and
implanting an element selected from the group consisting of cobalt, cesium and deuterium at a time selected from the group consisting of the times of prior to implanting the silicon and subsequent to annealing.

51. The semiconductor structure of claim 50, wherein the refractory metal is selected from the group consisting of titanium, tungsten, tantalum, cobalt and molybdenum.

52. The semiconductor structure of claim 50, wherein the implanted element is implanted into the refractory metal silicide.

53. The semiconductor structure of claim 50, wherein the implanted element is implanted into the layer of refractory metal prior to implanting the silicon therein.

54. A semiconductor structure, comprising:
a substrate; and
a layer containing at least two compounds and an implanted element selected from the group consisting of cobalt, cesium and deuterium formed on the substrate, wherein the layer containing the at least two compounds and the implanted element is formed by a method comprising:
implanting a first element into the substrate;
forming a layer of material, comprising the first element, on the substrate;
implanting a second element into the layer of material, to form a first implanted region;
implanting a third element into the layer of material, to form a second implanted region;
annealing to form the at least two compounds, the first compound comprising at least the first and second elements, and the second compound comprising at least the first and third elements; and
implanting an element selected from the group consisting of cobalt, cesium, and deuterium at a time selected from the group consisting of the times of prior to implanting the second element, prior to implanting the third element, and subsequent to annealing.

55. A semiconductor structure, comprising:
a substrate; and
a layer of material formed on the substrate, wherein the layer of material comprises titanium silicide and an implanted element selected from the group consisting of cobalt, cesium and deuterium, further wherein the layer of material is formed by a method comprising:
implanting titanium into the substrate;
forming a titanium layer on the substrate;
implanting silicon into the titanium layer;
annealing to form titanium silicide;
implanting nitrogen into the titanium layer at a time selected from the group consisting of the times of prior to annealing and subsequent to annealing; and
implanting an element selected from the group consisting of cobalt, cesium and deuterium at a time selected from the group consisting of the times of prior to implanting the silicon, and subsequent to annealing.

56. A semiconductor structure, comprising:
a substrate; and
a layer of material formed on the substrate, wherein the layer of material comprises refractory metal silicide and an implanted element selected from the group consisting of cobalt, cesium and deuterium.

57. The semiconductor structure of claim 56, wherein the layer of material further comprises refractory metal nitride.

58. A semiconductor structure, comprising:
a substrate; and
a layer containing at least two compounds and an implanted element selected from the group consisting of cobalt, cesium and deuterium formed on the substrate.

59. The semiconductor structure of claim 58, wherein one of the at least two compounds comprises a refractory metal silicide.

60. The semiconductor structure of claim 58, wherein one of the at least two compounds comprises a refractory metal nitride.

61. A semiconductor structure, comprising:
a substrate; and
a layer of material formed on the substrate, wherein the layer of material comprises titanium silicide and an implanted element selected from the group consisting of cobalt, cesium and deuterium.

62. The semiconductor structure of claim 61, wherein the layer of material is formed on a bottom of a contact hole.

63. The semiconductor structure of claim 62, wherein the contact hole further has sides defined by an insulator material selected from the group consisting of borophosphosilicate glass and doped oxides.

64. A semiconductor device interconnect, comprising:
a contact hole, wherein the contact hole has a substantially horizontal bottom and substantially vertical sides; and
a layer of material formed on the bottom of the contact hole, wherein the layer of material comprises a layer of refractory metal silicide, a layer of refractory metal nitride on the layer of refractory metal silicide, and an implanted element selected from the group of cobalt, cesium and deuterium.

65. A semiconductor device interconnect, comprising:
a contact hole, wherein the contact hole has a substantially horizontal bottom and substantially vertical sides; and
a layer of material formed on the bottom of the contact hole, wherein the layer of material comprises a layer of titanium silicide, a layer of titanium nitride on the layer of titanium silicide, and an implanted element selected from the group consisting of colbalt, cesium, and deuterium.

* * * * *

UNITED STATES PATENT AND TRADEMARK OFFICE
CERTIFICATE OF CORRECTION

PATENT NO.   : 6,262,485 B1
DATED        : July 17, 2001
INVENTOR(S)  : Thakur et al.

It is certified that error appears in the above-identified patent and that said Letters Patent is hereby corrected as shown below:

<u>Title page,</u>
Item [57], under ABSTRACT, delete entire paragraph:
"A method for lowering the anneal temperature required to form a multi-component material, such as refractory metal silicide. A shallow layer of titanium is implanted in the bottom of the contact area after the contact area is defined. Titanium is then deposited over the contact area and annealed, forming titanium silicide. A second embodiment comprises depositing titanium over a defined contact area. Silicon is then implanted in the deposited titanium layer and annealed, forming titanium silicide. A third embodiment comprises combining the methods of the first and second embodiments. In further embodiment, nitrogen, cobalt, cesium, hydrogen, flourine, and deuterium are also implanted at selected times."

and insert

-- A semiconductor structure includes a substrate and a layer of material formed on the substrate. The layer of material includes refractory metal silicide such as titanium silicide, and an implanted element such as cobalt, cesium or deuterium. The layer of material can also include a refractory metal nitride. In another example, a semiconductor structure includes a substrate and a layer containing at least two compounds and an implanted element such as cobalt, cesium or deuterium formed on the substrate. In another example, a semiconductor device interconnect includes a layer of material formed on the bottom of a contact hole which includes refractory metal silicide and nitride layers, and an implanted element such as cobalt, cesium or deuterium. --, therefor.

<u>Column 1,</u>
Line 26, delete "is being increased" and insert -- is increased --, therefor.

<u>Column 2,</u>
Line 26, delete "area Silicon" and insert -- area. Silicon --, therefor.

<u>Column 3,</u>
Line 39, delete "thousands digits" and insert -- thousands of digits --, therefor.

<u>Column 4,</u>
Line 1, delete "invention In" and insert -- invention. In --, therefor.

UNITED STATES PATENT AND TRADEMARK OFFICE
CERTIFICATE OF CORRECTION

PATENT NO. : 6,262,485 B1
DATED : July 17, 2001
INVENTOR(S) : Thakur et al.

It is certified that error appears in the above-identified patent and that said Letters Patent is hereby corrected as shown below:

Column 6,
Line 34, delete "arL" and insert -- art. --, therefor.

Column 11,
Line 24, delete "form" and insert -- from --, therefor.

Signed and Sealed this

Fourth Day of June, 2002

Attest:

Attesting Officer

JAMES E. ROGAN
Director of the United States Patent and Trademark Office